(12) United States Patent
Donath et al.

(10) Patent No.: US 6,274,916 B1
(45) Date of Patent: Aug. 14, 2001

(54) ULTRAFAST NANOSCALE FIELD EFFECT TRANSISTOR

(75) Inventors: Wilm E. Donath, New York; Dennis M. Newns, Yorktown Heights; Pratap C. Pattnaik, Ossining, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/443,367

(22) Filed: Nov. 19, 1999

(51) Int. Cl.[7] ............................ H01L 33/00; H01L 29/78
(52) U.S. Cl. ......................... 257/410; 257/192; 257/43; 257/279
(58) Field of Search ........................ 257/192, 43, 279, 257/410

(56) References Cited

U.S. PATENT DOCUMENTS

| | | | |
|---|---|---|---|
| 3,946,401 | * | 3/1976 | Young . |
| 5,418,389 | * | 5/1995 | Watanabe . |
| 5,623,439 | * | 4/1997 | Gotoh et al. . |
| 5,763,933 | * | 6/1998 | White . |
| 6,121,642 | * | 9/2000 | Newns . |

OTHER PUBLICATIONS

S. Thompson, P. Packan, and M. Bohr, "Mos Scaling: Transistor Challenges forthe 21st Century", Intel Technology Journal, Q3 1998, p. 1.

M. Izuha, K. Abe, and N. Fukushima, "Electrical Properties of All–Perovskite Oxide Capacitors," Jpn. Appl. Phys., 36,5866 (1997).

H. Takagi et al., "Systematic Evolution of Temperature–Dependant Resistivity," Phys. Rev. Lett., 69,2975 Nov. 16, 1992.

H. Koinuma et al., "Crystal Engineering of High Tc–Related Oxide Film," MRS Bulletin, vol. XIX, #9, (1994).

D.M. Newns et al., "Mott Transition Field Effect Transistor," Appl. Phys. Lett. 73,780 (1998).

R.A. McKee, F.J. Walter, and M.F. Chisholm, Phys. Rev. Lett., 81, 3014 (1998).

Imada et al., p. 13, "Metal–Insulator Transitions," Review of Modern Physics, vol. 20 No. 4 part 1, p. 1145–1146, Oct. 1998.

Iwasa et al., "Metal–insulator transition and antiferromagnetic order in bis (ethylenedithio) tetrathiaful valene tetracyanoquinodimethane,"Physics Review p. 14 B. vol. 49 No. 5, p. 3580–3583, Feb. 1994.

\* cited by examiner

*Primary Examiner*—Stephen D. Meier
(74) *Attorney, Agent, or Firm*—McGinn & Gibb, PLLC; Casey P. August, Esq.

(57) ABSTRACT

A method and structure for a field effect transistor (FET) includes a source region, a drain region, a channel region extending between the source region and the drain region, a gate region, and a gate oxide region separating the gate region from other regions of the FET. The channel region is a Mott insulator. The gate oxide region is thicker than the channel region, and the gate oxide region includes a higher dielectric permittivity than the Mott insulator material.

20 Claims, 7 Drawing Sheets

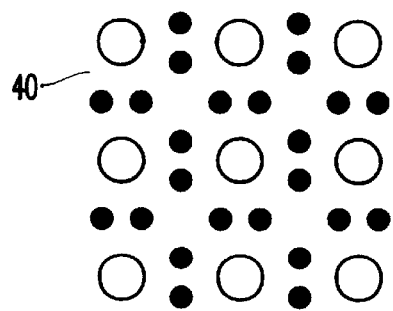
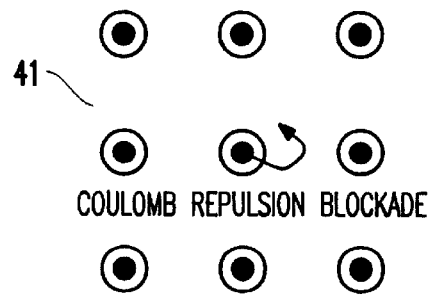
FIG.4A
FIG.4B
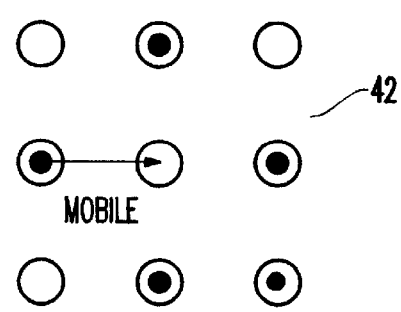
FIG.4C
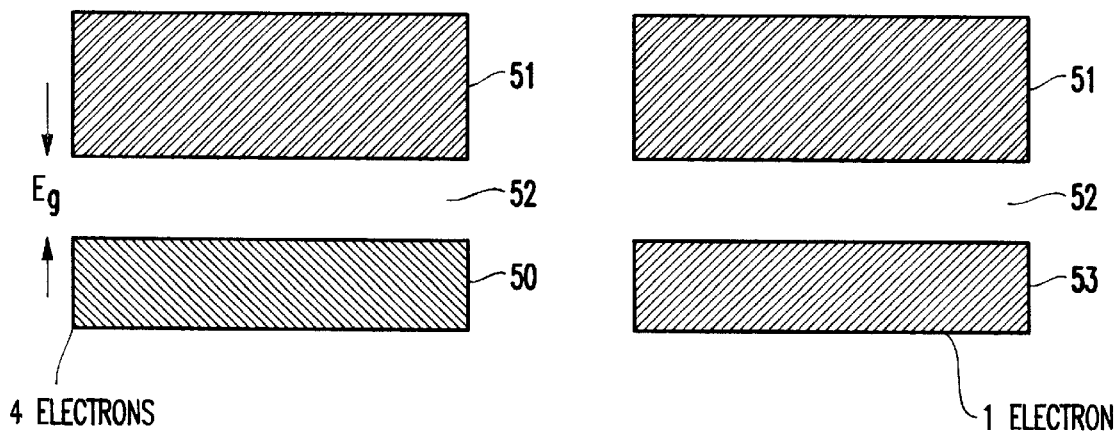
FIG.5A
FIG.5B
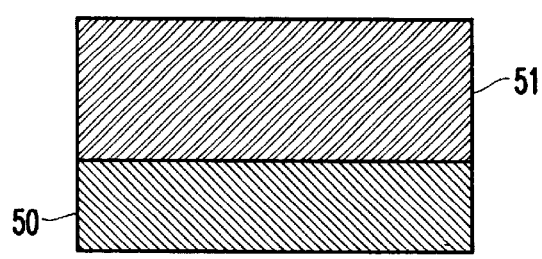
FIG.5C

US 6,274,916 B1

ULTRAFAST NANOSCALE FIELD EFFECT TRANSISTOR

BACKGROUND OF THE INVENTION

1. Field of the Invention

The present invention generally relates to field effect transistors (FET's) and more particularly to FET's which are capable of operating properly at nanoscale dimensions.

2. Description of the Related Art

The metal oxide semiconductor field effect transistor (MOSFET) is the universal switching device in current computer logic and memory technology. The on-chip density and speed of MOSFETs has doubled every few years, resulting in the high performance of present day logic and, following Moore's Law, in memory. However, recent predictions show that, in its present form with Si as the semiconductor and $SiO_2$ as the gate insulator, the MOSFET cannot be reduced in scale below a channel length of approximately 55 nm. This will result in less rapid performance improvement in logic chips, and eventually in performance saturation within a few years, unless significant design or material changes can be implemented within the relevant time frame.

The invention described below is a high performance nanoscale field effect transistor (nanoscale FET) designed to be fabricated at scales corresponding to a channel length on the order of 1 nm. The FET according to the invention, termed the "nanoscale FET", is also an extremely fast switch. In terms of on-chip device density and device speed, the nanoscale FET offers an improvement of about 100 over current in-process technology, amounting to a factor of 10,000 improvement in speed-density. The invention achieves these improvements over current technology by material and design changes relative to existing MOSFET design practice, as described below.

One application for the nanoscale FET is in future hybrid logic and memory technology "computer on a chip" high performance systems.

SUMMARY OF THE INVENTION

It is, therefore, an object of the present invention to provide a structure and method for an integrated circuit chip that includes a first conductor, a second conductor opposite the first conductor, a transition metal oxide below the first conductor and the second conductor, a gate insulator below the transition metal oxide region, and a gate conductor below the insulator. The gate insulator has a thickness and dielectric permittivity greater than that of the transition metal oxide. The dielectric permittivity is approximately 20 times higher than that of the transition metal oxide. The transition metal oxide includes conductively doped regions. The first conductor region and the second conductor region are positioned over the conductively doped regions of the channel region. The transition metal oxide includes undoped gaps between the conductively doped regions and the gate insulator. The distance between the first conductor and the second conductor is less than the thickness of the gate oxide region. The transition metal oxide has a carrier density of $10^{14}$ $cm^{-2}$ carriers per unit area. The integrated circuit chip further includes an epitaxial interface between the transition metal oxide and the gate insulator.

Another embodiment of the invention is an integrated circuit chip that includes a source region, a drain region opposite the source region, a channel region below the source region and the drain region, a gate oxide region below the channel region, and a gate region below the gate oxide region. The channel region includes a transition metal oxide material. The gate oxide region has a thickness greater than that of the channel region and a dielectric permittivity higher than that of the transition metal oxide material.

As shown below, the invention is a high performance nanoscale field effect transistor (nanoscale FET) designed to be fabricated at scales corresponding to a channel length on the order of 1 nm. The inventive nanoscale FET is capable of being fabricated at on-chip densities on the order of 100 times that of current MOSFET devices, and to switch in times on the order of 1/100 of current MOSFET devices (e.g., 283 fs).

BRIEF DESCRIPTION OF THE DRAWINGS

The foregoing and other objects, aspects and advantages will be better understood from the following detailed description of a preferred embodiment of the invention with reference to the drawings, in which:

FIG. 3b is a plot of the output voltage and input voltage produced by the ring oscillator in FIG. 3a;

FIGS. 4a–c are schematic drawings of a semiconductor, Mott insulator, and metallized Mott insulator;

FIGS. 5a–c are schematic diagrams illustrating the valence and conduction bands in a semiconductor.

DETAILED DESCRIPTION OF PREFERRED EMBODIMENTS OF THE INVENTION

The invention described below is a high performance nanoscale field effect transistor (nanoscale FET) designed to be fabricated at scales corresponding to a channel length on the order of 1 nm. Such a scale is considered to be about ⅕ of the minimum achievable with conventional metal oxide semiconductor field effect transistor (MOSFET) technology. The inventive nanoscale FET is capable of being fabricated at on-chip densities on the order of 100 times that of current MOSFET devices, and to switch in times on the order of 1/100 of current MOSFET devices.

Figure 1:
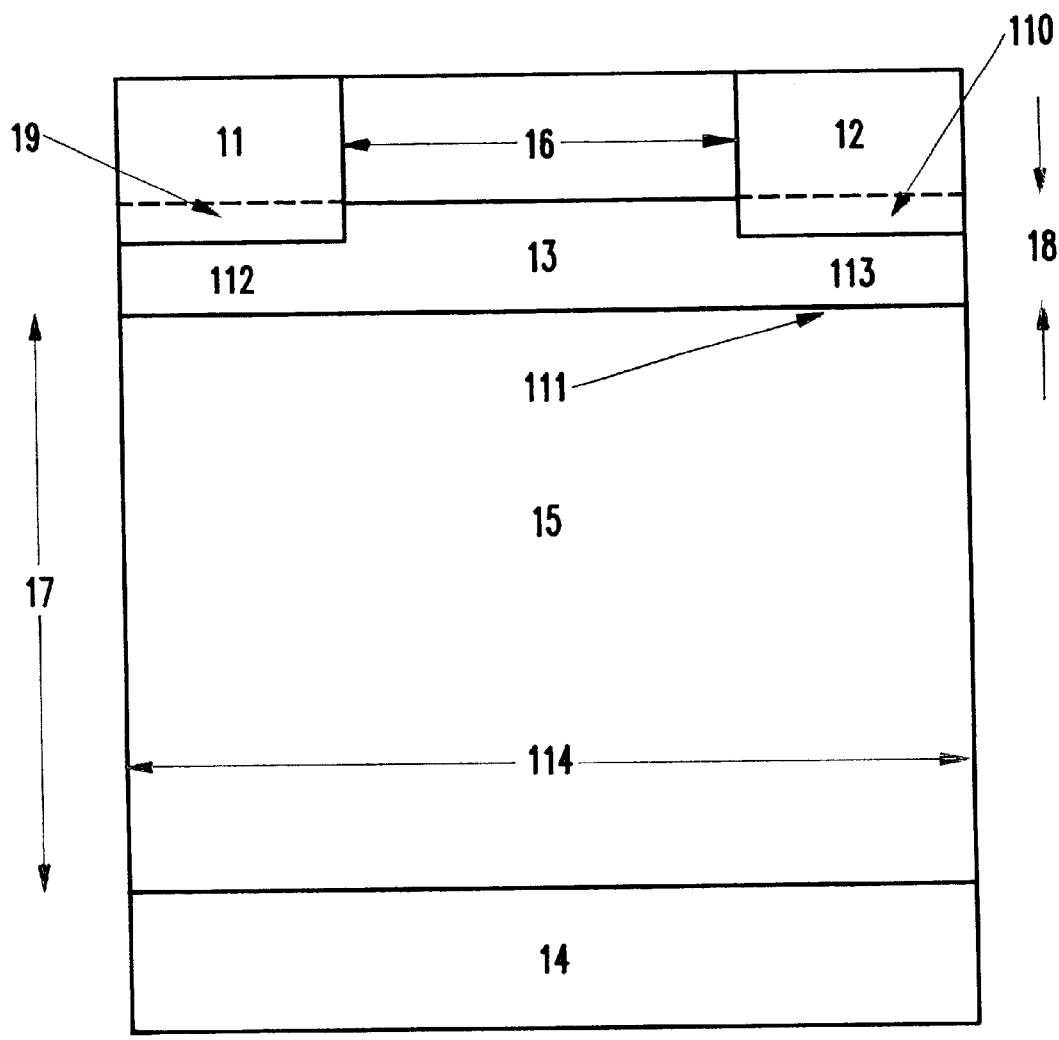
FIG. 1 is a schematic diagram of a cross section of a device built according to the invention.

Referring now to the drawings, and more particularly to FIG. 1, one example of the inventive field effect transistor is illustrated. As would be known by one ordinarily skilled in the art, the invention is not limited to the example shown in FIG. 1, but is applicable to any similar device.

In the example shown in FIG. 1, the field effect transistor includes a source region 11, a drain region 12, a channel region 13 extending between the source and drain regions, a gate electrode 14, and a gate oxide region 15 electrically insulating the gate electrode 14 from the other regions of the FET. The gate electrode 14 is located on the opposite side of the channel region 13 from the source and drain regions.

The channel region 13 is formed of a material capable of supporting both a very high carrier density (e.g., $10^{14}$ $cm^{-2}$ carriers per unit area) and an abrupt dopant profile. The channel region 13 is, for example, a transition metal oxide such as a perovskite structure. In many cases, the transition metal oxide will be a Mott insulator. The case of a device with a Mott insulating channel material has been discussed in more detail in Newns et al., *Mott Transition Field Effect Transistor*, Applied Physics Letters, Vol 73, Number 6, pages 780–782, Aug. 10, 1998, incorporated herein by reference.

The gate oxide region is a high dielectric constant (high permittivity) material (e.g., a perovskite structure ferroelectric such as $SrTiO_3$ or $Ba_xSr_{1-x}TiO_3$). The dielectric constant of the gate oxide material is preferably much larger than that of the channel material (e.g., 20×larger).

The distance 16 (channel length) between the source and drain regions 11, 12 may be any length required for a given application and in this example is 10 nm. The thickness 17 of the gate oxide region 15 is relatively larger than the channel length 16. For example in this example the gate oxide thickness 17 is 15 nm. The thickness 18 of the channel material is relative to the channel length 16. In this example, the channel material thickness 18 is 2 nm.

The source and drain regions include electrodes 11, 12 plus heavily doped regions 19, 110 (e.g., 0.15 carriers per unit cell of 0.064 $nm^3$). There is an epitaxial interface 111 between the channel region and the gate oxide region.

The above example uses a perovskite structure ferroelectric as the gate oxide 15 and a perovskite Mott insulator material as the channel 13 since these are known to be capable of forming an epitaxial interface, (H. Koinuma et al., *Crystal Engineering of High $T_c$-Related Oxide Films*, MRS Bulletin, Vol. XIX, #9, (1994), incorporated herein by reference). Additionally, it is known that the cuprate materials such as $La_2CuO_4$ can support a jump in doping profile such as is required in the heavy doping regions 19,110 in the invention, (Koinuma et al., Supra). Moreover, the electrical properties of these channel materials are satisfactory (H. Takagi et al., *Systematic Evolution of Temperature-Dependant Resistivity in $La_{2-x}Sr_xCuO_4$*, Phys. Rev. Lett., 69, 2975, 1992, incorporated herein by reference), as are those of the gate oxide, (M. Izuha et al., *Electrical Properties of All-Perovskite Oxide ($SrRuO_3/BaxSr_{1-x}TiO_3TiO_3/SrRuO_3$) Capacitors*, Jpn. J. Appl. Phys. 36, 5866 (1997) incorporated herein by reference).

There are specific features of the invention that enable it to function, unlike conventional MOSFET designs, at nanoscopic scales. One feature is the high carrier density (e.g., $10^{14}$ $cm^{-2}$ carriers per unit area) in the channel 13 that yields acceptable performance without extremely high mobility, which is valuable since mean free paths are constrained by channel length.

Also, the transition metal oxide channel material has an extremely short screening length. Screening length is defined as the characteristic length over which the field of an added test charge decays away to zero; this is long in a semiconductor, short in a metallic material. The short screening length enables the carriers in the channel 13 to be localized in a layer at the interface 111 with the gate oxide 15 which is very thin (thickness of order 0.5 nm) relative to the channel length 16 (10 nm).

Another feature of the invention is that the gate oxide thickness 17 is relatively large (e.g., 15 nm), which minimizes gate leakage current. Also, the dielectric constant (permittivity) of the gate oxide 15 is relatively large (e.g. 500), in order to achieve a high carrier density in the channel.

Also, with the invention, the ratio of the dielectric constant of the gate oxide material 15 to that of the channel material 13 is large (e.g., 20). This high ratio prevents the potential of the drain region 12 from significantly penetrating the region occupied by the carriers in the channel 13. Otherwise, such penetration would lead to "short channel effects". In a conventional MOSFET, the dielectric constant ratio is just the contrary. The dielectric constant of the channel conventionally is greater than that of the gate oxide.

Yet another feature of the invention is that the impedance at the source and drain regions 11, 12 is reduced by the extension of carrier gas under the source 11, and to a lesser extent under the drain region 12, when the device is ON. Also, the impedance is reduced by the regions of high doping 19, 110 under the source and drain electrodes 11, 12, and the short distance between the regions 19, 110 and the carrier gas layer. The gaps 112, 113 between the source and drain regions 11, 12 and the epitaxial interface 111 between the channel region 13 and the gate oxide region 15 are necessary to minimize penetration of the drain potential through the high dielectric constant gate oxide region 15 into the channel region 13, to prevent short channel effects. In one example, the gaps 112, 113 are preferably approximately one-half the thickness of the channel region 13, but could be experimentally varied to achieve any specific design goal.

The device in FIG. 1 in this example is a p-type embodiment and is analyzed by considering Quantum statistics of the carriers, since, when the device is ON, the carriers form a degenerate gas (e.g., carrier gas). The channel material is taken as having a cubic unit cell of lattice parameter 0.4 nm. The density of states of the carrier gas is taken (with quasi-2D properties of materials such as $La_2CuO_4$ in mind) as having a 2D form independent of energy, and equal to 0.25 $eV^{-1}$ per cell. The remaining properties are specified above. The benchmark for carrier mobility in the channel is derived from the resistivity of the material $La_{1.85}Sr_{0.15}CuO_4$, (H. Takagi et al., Supra), which is chemically p-doped to high concentration and is deemed to have similar electrical properties to the material $La_2CuO_4$ when it is electrically doped to a similar carrier concentration.

Figure 2A:
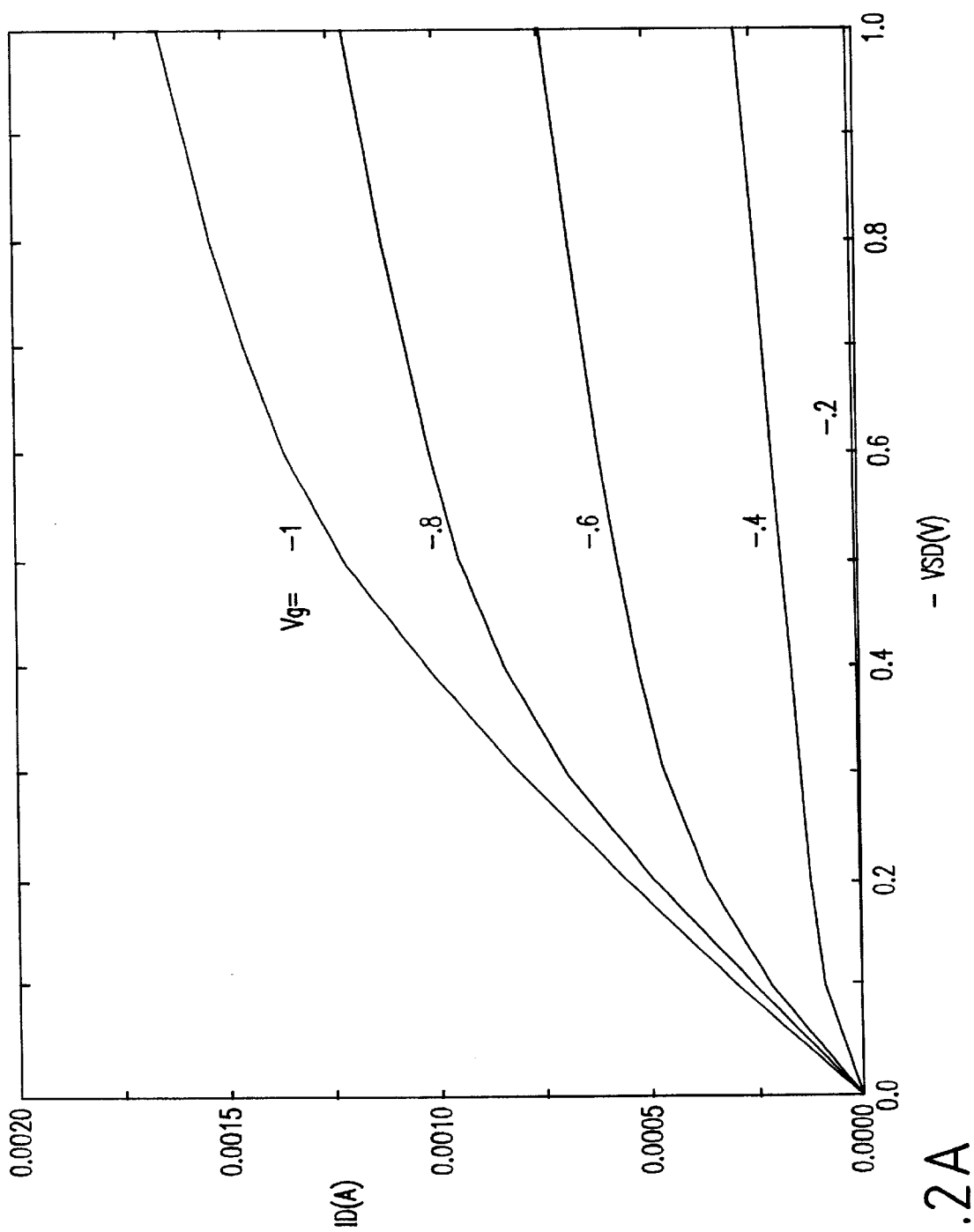
FIG. 2a is a plot of the electric current produced by the inventive device.

FIG. 2a is a plot of the electric current ($I_D$) between the source and drain of the device shown in FIG. 1 vs. the voltage ($V_D$) between the source and drain, for various voltages ($V_G$) between the gate and the source, indicated by labels on the curves. In FIG. 2, exemplary parameters of the device are as follows. The carriers are p-type. The channel length 16 is 10 nm and the channel width is 40 nm. The device length 114 is 16 nm. The channel thickness 18 is 2 nm The gate oxide thickness 17 is 15 nm. The depth of doping 19, 110 is 0.8 nm The magnitude of doping is 0.15 carriers per unit cell of 0.064 $nm^3$. The gate oxide dielectric constant is 500. The channel dielectric constant is 25. The threshold $E_{B0}$ is 0.35 eV. The channel density of states taken as constant $N_D$ is 0.25 $eV^{-1}$.

Figure 2B:
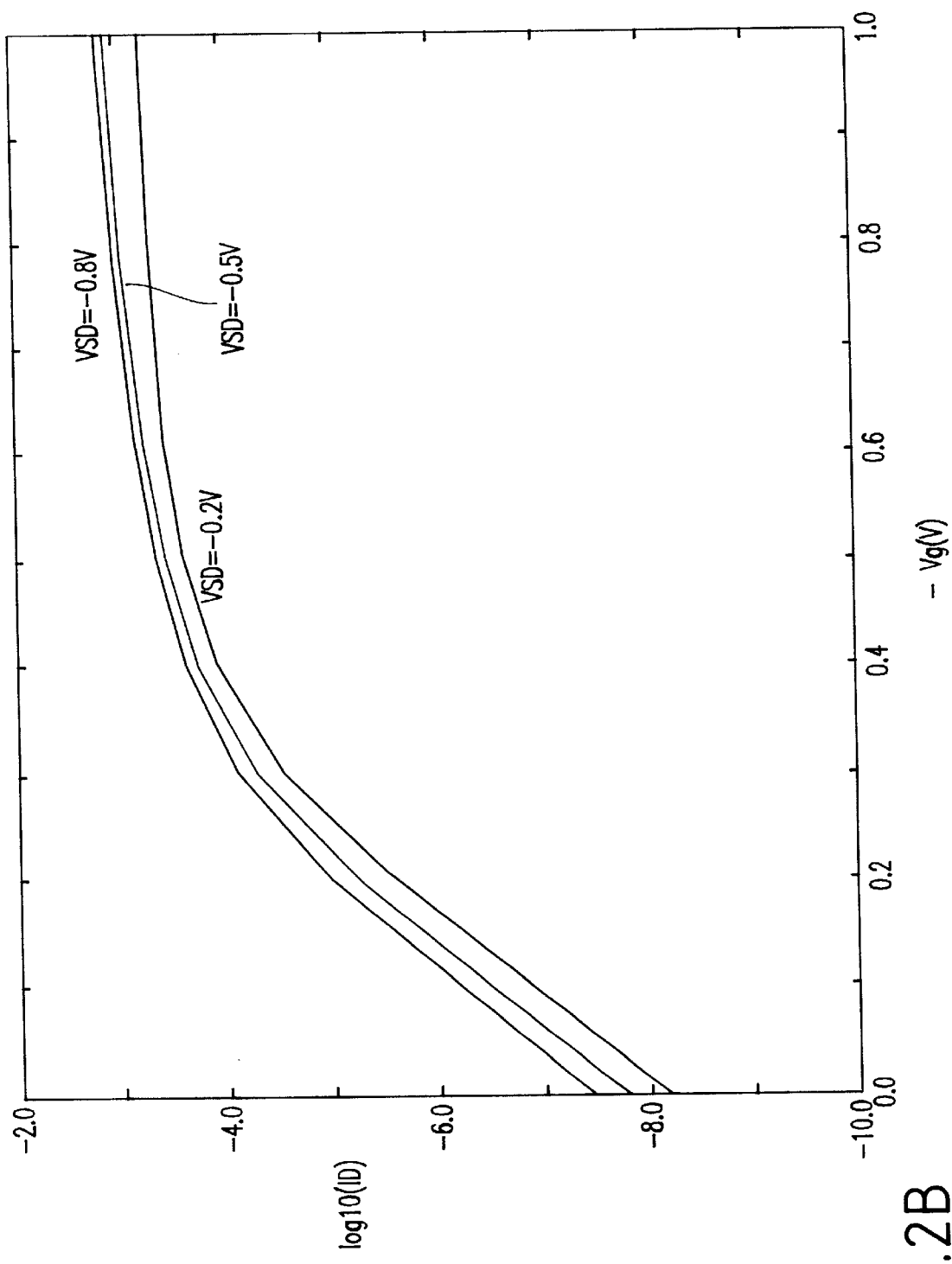
FIG. 2b is a plot of the logarithm of the current produced by the inventive device.

FIG. 2b is a plot of the logarithm of the current $I_D$ vs. $V_G$, for various voltages ($V_D$) between the drain and the source of the example shown in FIG. 1, as indicated by labels on the curves. The parameters are the same as in FIG. 2a.

The example of the invention shown in FIG. 2a is a majority carrier MOSFET, which can be either p-type or n-type, according to the selection of materials. The following discussion concerns a p-type device, but, as would be known by one ordinarily skilled in the art given this disclosure, is readily modified to an n-type device.

When the gate is connected to the source, the device is OFF. In this condition the top of the valence band in the channel lies at an energy denoted by the threshold $E_{B0}$ below the chemical potential in the source electrode, and the number of carriers in the channel is very low, consequently a very low current flows in the channel (see FIG. 2b). Threshold $E_{B0}$ is a property which depends on the selection of the channel and source/drain electrode materials.

When a negative voltage is applied to the gate, the valence band in the channel is shifted up towards the chemical potential in the source and drain by the electrostatic potential of the gate. Holes are thus injected into the channel, where they form a degenerate hole Fermi gas (e.g., carrier gas). The hole gas in the channel enables conduction to occur in the channel (FIGS. 2a–2b).

The drain characteristics illustrated in FIGS. 2a–2b show that the device static characteristics are satisfactory from the engineering point of view. In particular, the characteristics (FIG. 2a) nearly saturate when the drain voltage exceeds the gate voltage, adequate current (1 mA) is passed by the device when in its ON state, and the device has a reasonable ON/OFF ratio on the order of 105 (FIG. 2b), which is estimated as sufficient to prevent static current drain dominating the power budget of the chip.

Figure 3A:
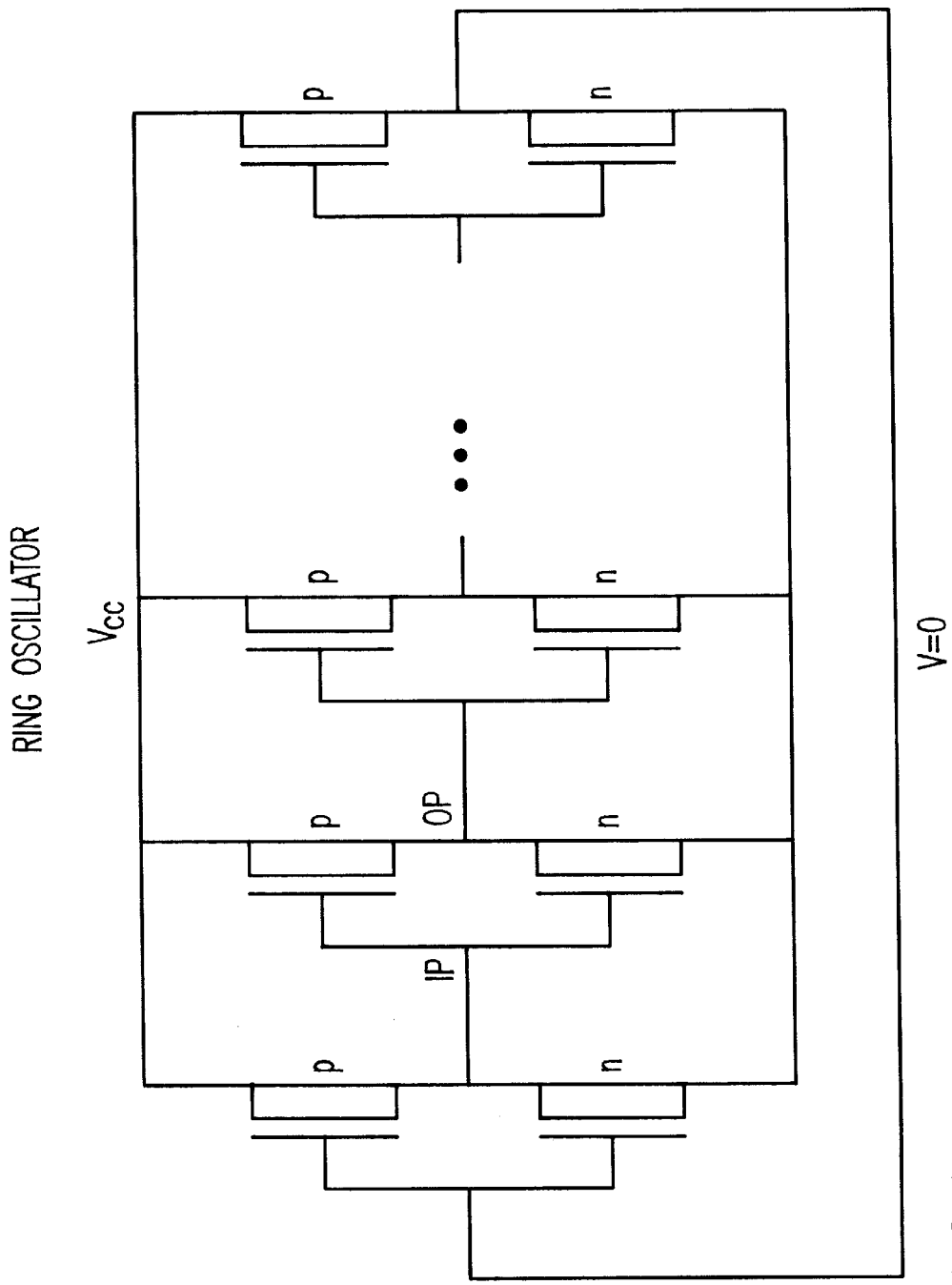
FIG. 3a is a schematic drawing of a ring oscillator configuration according to the invention.
Figure 3B:
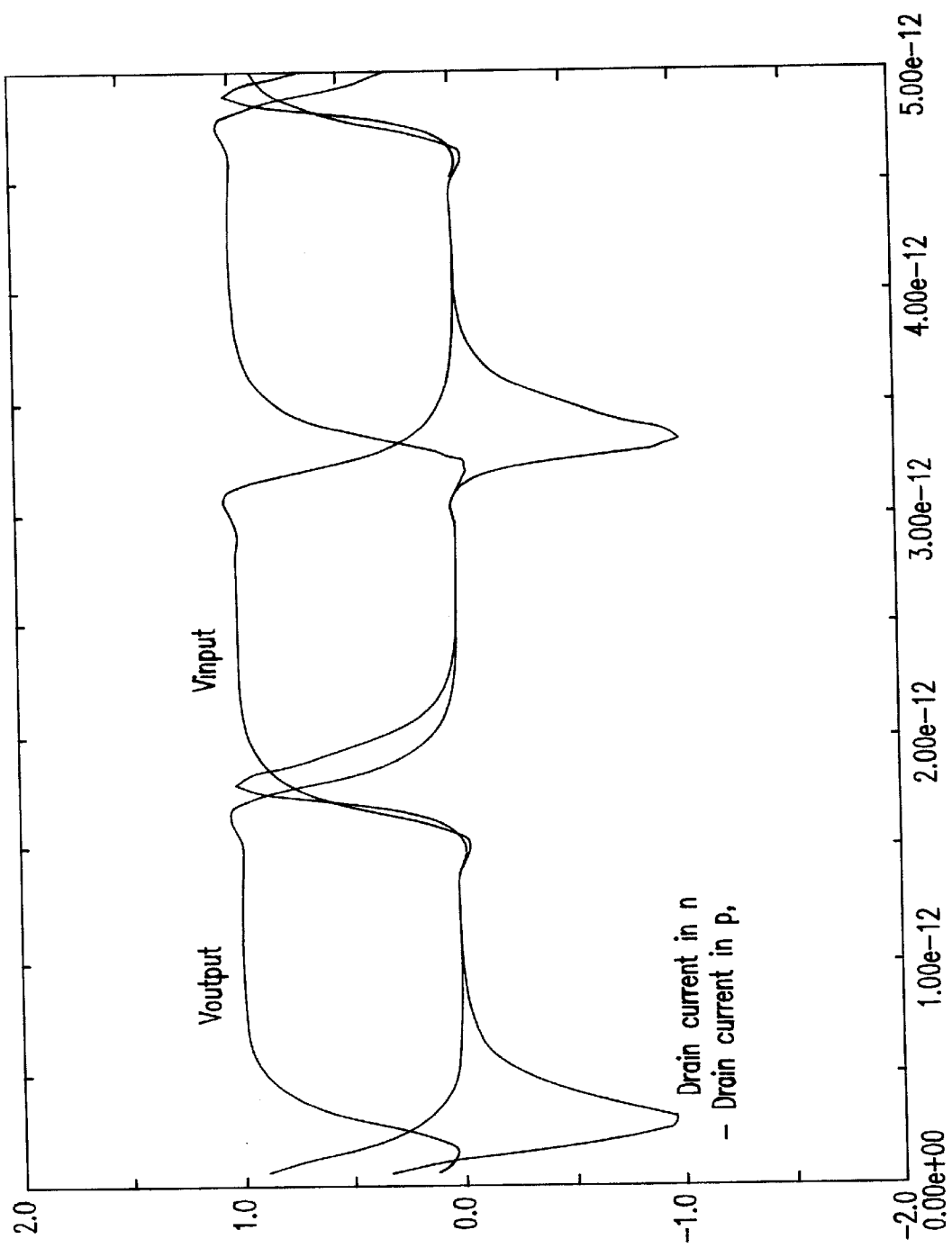

The invention's characteristics are further illustrated using the following example which is an 11-stage ring oscillator using the inventive transistors (FIG. 3a). The switching characteristics of one inverter stage are illustrated in FIG. 3b. The devices in the stage switch cleanly. The switching time per stage (e.g., the period of oscillation over the number of stages) is 283 fs. The device switching time is on the order of $\frac{1}{100}$ of that of circuits currently in the design stage.

More specifically, FIG. 3a is a schematic diagram of a ring oscillator configuration, comprising an odd number of inverter stages. Each stage includes the inventive p-type and n-type device. The drains of the devices are connected together to form the stage output (OP), and the gates are connected together to form the stage input (IP). The source of the n-type devices are connected to ground, and the source of the p-type devices are connected to the positive supply rail at $V_{cc}$. The ring oscillator is constructed by connecting the output of each stage to the input of the next stage.

FIG. 3b is a plot of the output voltage ($V_{output}$) and input voltage ($V_{input}$), both in volts, together with the difference between the drain current in the n-type device and that in the p-type device, for a single stage of the ring oscillator shown in FIG. 3a (which, in this example, has 11 stages), where $V_{cc}$=1V.

As alluded to above, Mott insulator is qualitatively different in nature to the regular, or band-type, insulator or semiconductor. FIGS. 4a–5c illustrate the energy band structure in the cases of a regular semiconductor 40, a Mott insulator 41, and a metallized Mott insulator 42.

As shown in FIG. 5a, in the semiconductor 40, the valence band 50 is filled with electrons (e.g., 4 electrons), and the conduction band 51 is empty, the two being separated by an energy gap 52. Because of spin degeneracy (equal number of up and down spin electrons), the semiconductor valence band 50 always holds an even number of electrons. The physics reflected by the valence band 50 filling is shown in the number of bonding electrons. In silicon (FIGS. 4a and 5a) there are four electrons in the atom, and also four single bonds.

In the simplest Mott insulator case (FIGS. 4b and 5b), there is typically one electron 53 (or hole) per atomic site (however there may be an odd number or an even number of electrons). The electron is bound to the site, because, if it attempts to hop to a neighboring site, it encounters a strong repulsion between it and the electron already occupying the site. Hence, the bound electron is surrounded by a repulsive Coulomb barrier due to the presence of the neighboring electrons, which by analogy with the similar phenomenon in Quantum Dots may be termed Coulomb Blockade, as shown in FIG. 4b. There is a condition for the stability of the Mott insulating state, the kinetic energy for intersite electron hopping, often termed t, must be less than the Coulomb repulsion U. This is expressed in FIG. 6 (see M. Imada et al., "Metal-Insulator Transitions", *Reviews of Modern Physics*, Vol. 20 No. 4 Part 1, pp. 1145–1146, October 1998, incorporated herein by reference).

Hence, a simple diagnosis of Mott insulating character is possible when the material has an odd number of electrons per cell, and is nevertheless found to be insulating, a situation which in the absence of electron-electron interactions would lead to a metal (e.g., the insulator $La_2CuO_4$ is found on inspection of the chemical formula to have divalent copper, i.e. one d hole per formula unit, making it presumably a Mott insulator).

Figure 6:
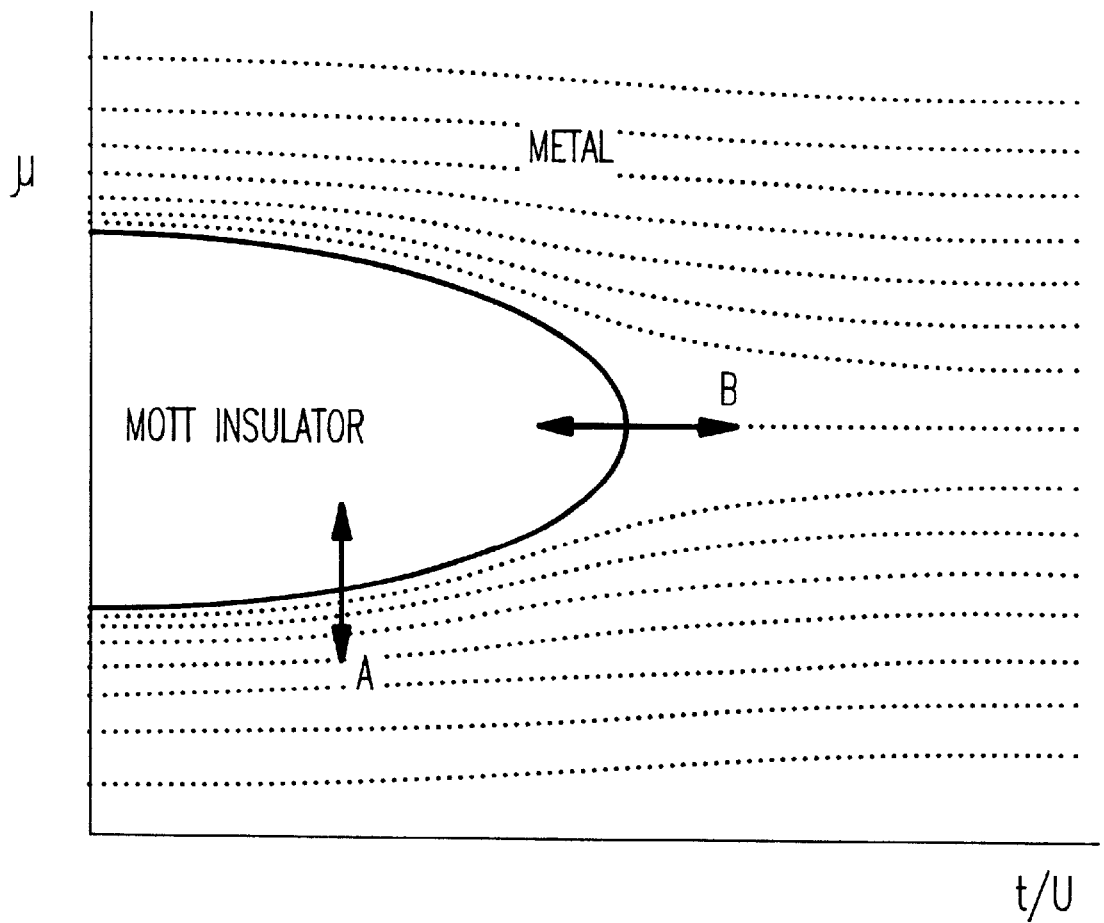
FIG. 6 is a schematic diagram illustrating the stability condition for the Mott insulating state.

As shown in FIG. 6, the Mott insulating state might be transformed into the metallic state by increasing the ratio of t to U (e.g., "B"), or altering the chemical potential λ (e.g., "A") (vertical axis in the figure), or equivalently the number of electrons. An example of changing the t to U ratio to metallize a system uses bis(ethylenedithio) tetrathiafulvalene tetracyanoquinodimethane (BEDT-TTF-TCNQ), where increasing the pressure presumably decreases the ratio t/U (see Y. Iwasa et al., "Metal-Insulator Transition and Antiferromagnetic Order in bis(ethylenedithio) tetrathiafulvalene tetracyanoquinodimethane (BEDT-TTF-TCNQ), *Physical Review B*, Vol. 49 No. 5, p. 3580–3583, February 1994, incorporated herein by reference. This method for metallization is termed bandwidth control (BC) in Imada et al., Supra, where Table IV p. 1145–1146 lists several examples.

An example of altering the chemical potential involves metallizing a system by varying the composition with dopants of different valences, so that holes are added to the system as shown in FIG. 4 (item 42). This makes it possible (with a sufficient concentration of holes) for the electrons to hop on to empty sites. The electrons no longer experience the Coulomb blockade and the gap 52 vanishes, as shown in FIG. 5c. This contrasts with a semiconductor 40, where in normal use there is always an energy gap present. Metallization by doping is termed filling control (FC) in Imada et al., Supra, where Table IV lists many examples.

Alternatively, a system can be metallized by varying the voltage on the gate of a Mott transition field effect transistor (MTFET) device. The application of a negative gate voltage, for example, will draw holes in from the source and drain of the device, again leading to the situation illustrated in FIGS. 4c and 5c. With sufficient concentration of holes (electrons) hopping on to empty sites leads to removal of the Coulomb blockade and the gap vanishes. The device is now metallized (e.g., conductive) and in the fully 'ON' state.

As would be known by one ordinarily skilled in the art given this disclosure, the geometry of the device could be replaced by a more conventional geometry with the source and drain on the same side of the channel as the gate depending upon the specific application involved.

As shown above, the invention is a high performance nanoscale field effect transistor (nanoscale FET) designed to be fabricated at scales corresponding to a channel length on the order of 1 nm. The inventive nanoscale FET is capable of being fabricated at on-chip densities on the order of 100 times that of current MOSFET devices, and to switch in times on the order of 1/100 of current MOSFET devices (e.g., 283 fs).

The very high carrier density of the Mott insulator channel region 13 in combination with the relatively thick gate oxide 15 and the doped regions 19, 110 (and associated gaps 112, 113) produces a field effect transistor on such small scales and with such fast switching times. Further, the high ratio of dielectric constants of the gate oxide 15 to that of the channel region 13 and the gaps 112, 113 prevents short channel effects, even at these high speeds and small scales.

While the invention has been described in terms of preferred embodiments, those skilled in the art will recognize that the invention can be practiced with modification within the spirit and scope of the appended claims.

What is claimed is:

1. An integrated circuit chip comprising:
   a first conductor;
   a second conductor opposite said first conductor;
   a transition metal oxide below said first conductor and said second conductor forming a channel region; and
   a gate insulator below said transition metal oxide region;
   a gate conductor below said insulator, wherein:
      said transition metal oxide includes conductively doped regions; and
      said first conductor region and said second conductor region are positioned over said conductively doped regions of said channel region.

2. The integrated circuit chip in claim 1, wherein said gate insulator has a dielectric permittivity higher than that of said transition metal oxide.

3. The integrated circuit chip in claim 1, wherein said gate insulator has a dielectric permittivity approximately 20 times higher than that of said transition metal oxide.

4. The integrated circuit chip in claim 1, wherein said transition metal oxide includes undoped gaps between said conductivity doped regions and said gate insulator.

5. The integrated circuit in claim 1, wherein a distance between said first conductor and said second conductor is less than said thickness of said gate oxide region.

6. The integrated circuit chip in claim 1, wherein said transition metal oxide has a carrier density of $10^{14}$ cm$^{-2}$ carriers per unit area.

7. The integrated circuit chip in claim 1, further comprising an epitaxial interface between said transition metal oxide and said gate insulator.

8. An integrated circuit chip comprising:
   a source region;
   a drain region opposite said source region;
   a channel region below said source region and said drain region,
   a gate oxide region below said channel region; and
   a gate conductor region below said gate oxide region, wherein:
      said channel region comprises a transition metal oxide material;
      said gate oxide region has a dielectric permittivity greater than said transition metal oxide material;
      said channel region includes conductively doped regions; and
      said source region and said drain region are conductive and are positioned over said conductively doped regions of said channel region.

9. The integrated circuit chip in claim 8, wherein said channel region includes undoped gaps between said conductively doped regions and said gate oxide region.

10. The integrated circuit in claim 8, wherein a distance between said source region and said drain region is less than said thickness of said gate oxide region.

11. The integrated circuit chip in claim 8, wherein said gate oxide region has a dielectric permittivity 20 times higher than that of said channel region.

12. The integrated circuit chip in claim 8, wherein said channel region has a carrier density of $10^{14}$ cm$^{-2}$ carriers per unit area.

13. The integrated circuit chip in claim 8, further comprising an epitaxial interface between said channel region and said gate oxide region.

14. A field effect transistor comprising:
   a first conductor;
   a second conductor opposite said first conductor;
   a transition metal oxide below said first conductor and said second conductor forming a channel region;
   a gate insulator below said transition metal oxide region; and
   a gate conductor below said insulator, wherein:
      said transition metal oxide includes conductively doped regions; and
      said first conductor region and said second conductor region are positioned over said conductively doped regions of said channel region.

15. The field effect transistor in claim 14, wherein said gate insulator has a dielectric permittivity higher than that of said transition metal oxide.

16. The field effect transistor in claim 14, wherein said gate insulator has a dielectric permittivity approximately 20 times higher than that of said transition metal oxide.

17. The first effect transistor in claim 14, wherein said transition metal oxide includes undoped gaps between said conductivity doped regions and said gate insulator.

18. The field effect transistor in claim 14, wherein a distance between said first conductor and said second conductor is greater than said thickness of said gate oxide region.

19. The field effect transistor in claim 14, wherein said transition metal oxide has a carrier density of $10^{14}$ cm$^{-2}$ carriers per unit area.

20. The field effect transistor in claim 14, further comprising an epitaxial interface between said transition metal oxide and said gate insulator.

* * * * *